United States Patent
Kern

(10) Patent No.: US 7,158,416 B2
(45) Date of Patent: Jan. 2, 2007

(54) METHOD FOR OPERATING A FLASH MEMORY DEVICE

(75) Inventor: Thomas Kern, München (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 106 days.

(21) Appl. No.: 11/081,085

(22) Filed: Mar. 15, 2005

(65) Prior Publication Data

US 2006/0209609 A1    Sep. 21, 2006

(51) Int. Cl.
*G11C 11/34* (2006.01)
(52) U.S. Cl. .............. 365/185.22; 365/185.29; 365/218
(58) Field of Classification Search ........... 365/185.22, 365/185.29, 185.33, 218, 201
See application file for complete search history.

(56) References Cited

U.S. PATENT DOCUMENTS

| | | | |
|---|---|---|---|
| 5,369,615 A | | 11/1994 | Harari et al. |
| 5,615,154 A | * | 3/1997 | Yamada ................. 365/185.22 |
| 5,768,192 A | | 6/1998 | Eitan |
| 5,841,721 A | * | 11/1998 | Kwon et al. ................ 365/218 |
| 5,920,502 A | * | 7/1999 | Noda et al. ............ 365/185.09 |
| 5,991,206 A | * | 11/1999 | Shin ...................... 365/185.29 |
| 6,011,725 A | | 1/2000 | Eitan |
| 6,046,939 A | | 4/2000 | Noda et al. |
| 6,331,951 B1 | * | 12/2001 | Bautista, Jr. et al. ... 365/185.22 |
| 2004/0255225 A1 | | 12/2004 | Takai |
| 2005/0041515 A1 | | 2/2005 | Futatsuyama et al. |

* cited by examiner

*Primary Examiner*—Anh Phung
(74) *Attorney, Agent, or Firm*—Slater & Matsil, L.L.P.

(57) ABSTRACT

An error correction code is applied and an erasing procedure is passed as accomplished, if a maximum number of single bit failures in compliance with a criterion of the error correction code is not exceeded.

20 Claims, 2 Drawing Sheets

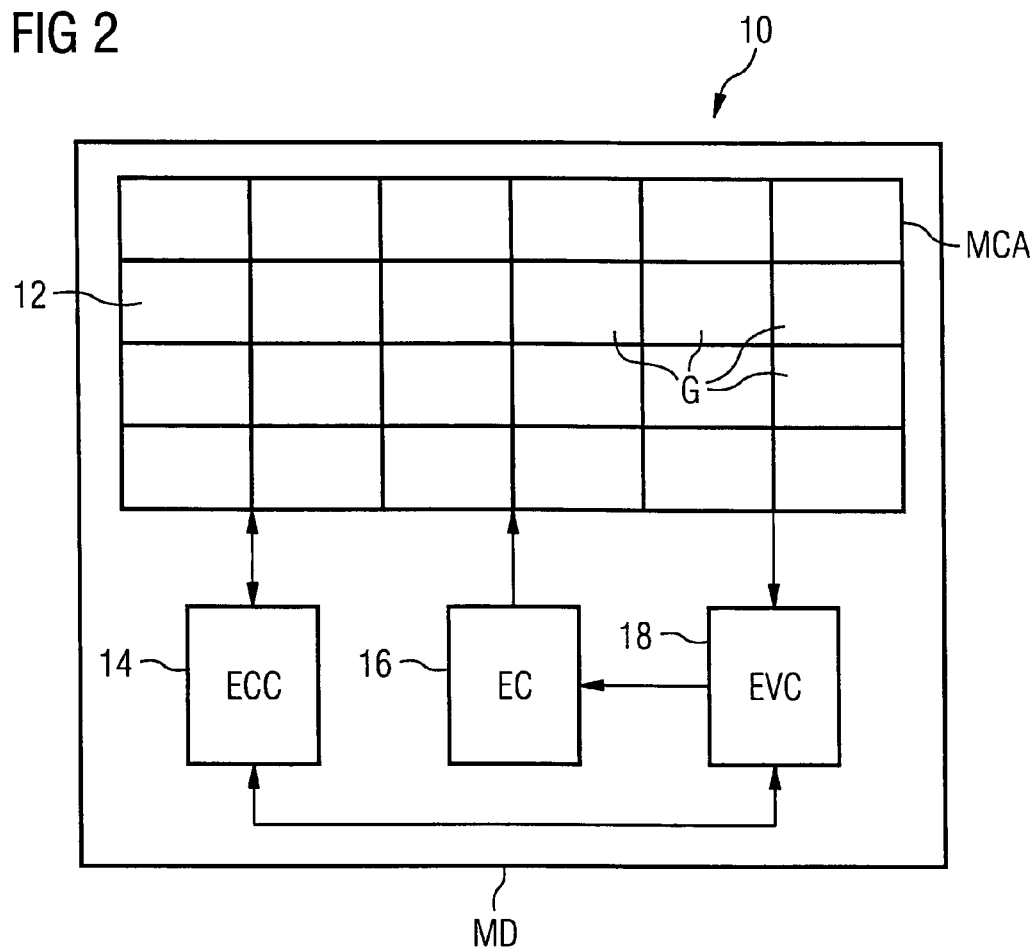

METHOD FOR OPERATING A FLASH MEMORY DEVICE

TECHNICAL FIELD

The present invention concerns the erase procedure of a flash memory device, in which blocks, pages or any other clusters of bits are erased simultaneously.

BACKGROUND

Non-volatile memory devices that are electrically programmable and erasable can be realized as flash memory devices, in which memory cells are programmed individually, but erased in blocks or pages. One type of flash memory comprises charge-trapping memory cells having a memory layer sequence of dielectric materials, in which a memory layer is arranged between confinement layers of a dielectric material having a larger energy band gap than the material of the memory layer. The memory layer sequence is located at a surface of a semiconductor body between a channel region of semiconductor material and a gate electrode that is provided to control the channel by means of an applied electric voltage. Examples of charge-trapping memory cells are the SONOS memory cells, in which each confinement layer is an oxide and the memory layer is a nitride of the semiconductor material, usually silicon (see, e.g., U.S. Pat. Nos. 5,768,192 and 6,011,725, which are both incorporated herein by reference).

In flash memory devices, blocks or pages are erased simultaneously. This means that no single bits are erased individually, but a certain number of memory cells are addressed at the same time, when an erasure is performed. As a thorough and complete erasure of all the relevant memory cells cannot be guaranteed, the erasure is usually followed by a verification step, in which single bit failures are detected and the erasing procedure is repeated, if necessary, until the erasure of all the relevant bits is verified. The repetition of the erasing procedure can be effected with increased voltages or some other modification of the operating parameters in order to secure that a complete erasure is finally obtained. This has the disadvantage that an over-erasure may occur, which leads to a decline in the endurance and data retention capability of the memory cells. The repetition of the erasing procedure causes an increase of erasing times and hence inferior write performances.

SUMMARY OF THE INVENTION

In one aspect, the present invention presents a method for operating a flash memory device, which improves and helps to speed up the erase and write procedures while at the same time securing sufficient endurance and data retention.

In a further aspect, this invention secures a sufficient erasing while preventing the memory cells from over-erasure.

This method for operating a flash memory device according to the preferred embodiment of the invention makes use of an error correction code also in the erasing procedure. A number of single bit failures appearing in an erasing procedure are detected and recorded for every simultaneously erased group of memory cells, for example for every block or page of the memory cell array of the device. The erasing procedure is passed as accomplished, if the numbers of single bit failures comply with a criterion of the error correction code. Otherwise, a further erasing is effected, until an erasure is achieved, which is sufficiently complete in conformity with the conditions defined by the application of the error correction code. For instance, the criterion may be that the sum of all the numbers of single bit failures in the erased groups does not exceed a given tolerable maximum total number of failures. Instead, an erasing procedure can be passed as accomplished, if at most a fixed number of single bit failures, five for example, or a variable number of single bit failures that is specified by the error correction code are verified in every erased group. Preferably, the error correction code is also provided to correct bits of information in read and write operations according to a standard usage of error correction codes. Thus, a provided error correction code circuit may partially serve the special application according to the preferred embodiment of this invention and partially be applied in the ordinary way to correct bits of the stored information.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages reference is now made to the following descriptions taken in conjunction with the accompanying drawings, in which:

FIG. 2 shows a block diagram of a preferred embodiment memory device.

DETAILED DESCRIPTION OF ILLUSTRATIVE EMBODIMENTS

Figure 1:
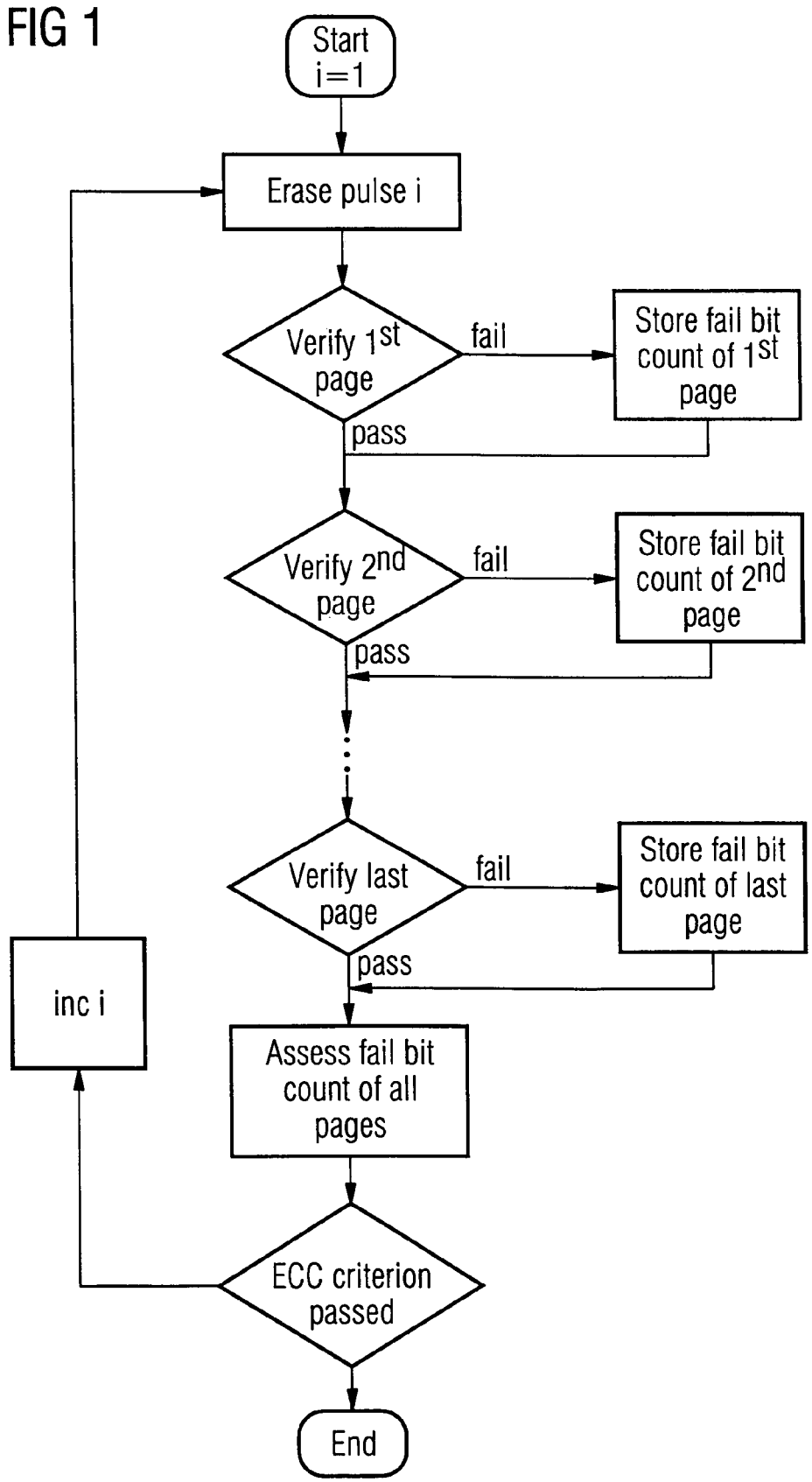
FIG. 1 shows a flow chart representing relevant steps of the inventive method.

In one aspect, the present invention takes advantage of use of an error correcting code when reading data from a non-volatile memory array. In particular, when erasing the array, a number of errors that can detected and corrected are allowed to remain in the array. It has been found that the overall performance of the array can be increased by allowing errors in some cells in order to avoid over-erasure in other cells.

The preferred embodiment inventive method allows single bit failures in the verification of the erasing procedure. This is made possible by an application of an error correction code, which is available also in the erasing procedure and preferably covers the correction of up to five bits per block or page. Based on this error correction code, the erasing procedure can be passed as accomplished even if the criterion of a complete erasure is not fulfilled. The bits that take more time to be erased can be ignored, and the erasing time can be reduced. Depending on the cell deviation, this improvement can be very important. Furthermore, the reduction of the erasing time also reduces the stress on the already sufficiently erased memory cells and avoids that these cells are forced to an over-erased state. Avoiding an over-erasure significantly increases the number of possible write cycles and also improves data retention after cycling. The error correction code may be applied in full or only partially to leave sufficient capacity for the ordinary programming operations. It works principally in the same way in the erasing procedure as in the usual write and read operations, in which the error correction code is used to correct or reconstruct corrupted bits of the stored information.

The flow chart of FIG. 1 shows the steps of a preferred example of the method according to this invention. The erasing starts with the application of a first erase pulse. The result of the erasure is then verified for the first and the following blocks or pages in sequence. The number of single bit failures is recorded and stored for every block or page. A final assessment takes place, by which a total of the numbers of single bit failures is evaluated and compared with previously defined criterions of the error correction code. If the criteria are fulfilled, the erasing procedure is passed as accomplished. In the opposite case, the number of the erase pulses is increased by one, and the described sequence of program steps is repeated. Each repetition can be performed with an increase of the applied erasing voltage or other adjustments of the erasing parameters that are favorable to a thorough erasure. This will ensure that a sufficient number of bits is erased correctly so that the criterion of the error correction code is met. If this is the case, the erasing procedure is regarded as completely accomplished, and the error correction code is applied to correct any deviation of the actual states of the erased memory cells from the state of erasure.

FIG. 2 illustrates a block diagram of a memory device 10 according to embodiments of the invention. A memory cell array (MCA) 12 includes a plurality of groups G of flash memory cells. The groups can be arranged according to structural features of the array. Alternatively, the subdivision of the memory cell array into groups may not be realized in the device structure, but only in the operating circuitry. Error correction code (ECC) circuitry 14 is coupled to the array 12. The error correction code circuitry 14 is operable to detect and correct errors in data being read from the array. Also, coupled to the array 12 is erase circuitry 16, which is operable to cause all flash memory cells in a selected group to be effected by an erase procedure.

Erase verification circuitry 18 is also coupled to the array, as well as to erase circuitry 16 and ECC circuitry 14. The erase verification circuitry 18 is operable to read data from the flash memory cells in the selected group after the erase procedure has been effected. The erase verification circuitry detects a number of single bit failures and determines whether the erase procedure is to be repeated. The erase procedure will be repeated if the number of single bit failures falls outside a criterion. As before, the criterion is based upon a number of failures that are correctable by the error correction code circuitry 14.

Although the present invention and its advantages have been described in detail, it should be understood that various changes, substitutions and alterations can be made herein without departing from the spirit and scope of the invention as defined by the appended claims.

What is claimed is:

1. A method for operating a flash memory device, the method comprising:
subdividing an array of memory cells into groups of memory cells;
simultaneously performing an erasing procedure on each of the memory cells in at least one of the groups of memory cells;
detecting a number of single bit failures in the erasing procedure; and
if the number of single bit failures falls outside a criterion, performing a further erasing procedure, wherein the erasing procedure is complete when the numbers of single bit failures falls within the criterion, and wherein the criterion is based upon an correctable number of failures when implementing an error correction code.

2. The method of claim 1, wherein the criterion is determined as a tolerable maximum total number of failures.

3. The method of claim 1, wherein the error correction code is also provided to correct bits of information in read and write operations.

4. The method of claim 3, wherein detecting a number of single bit failures comprises summing the number of single bit failures to give a total number, and wherein the criterion is determined as a tolerable maximum total number of failures.

5. The method of claim 3, wherein the error correction code is also provided to correct bits of information in read and write operations.

6. The method of claim 1, wherein the flash memory device comprises a SONOS memory device.

7. The method of claim 1, wherein the flash memory device comprises a floating gate memory device.

8. The method of claim 1, wherein the criterion comprises between one and five bits per group of memory cells.

9. A method for operating a flash memory device, the method comprising:
subdividing an array of memory cells into groups of memory cells;
performing an erasing procedure on each of said groups simultaneously;
detecting and recording a number of single bit failures in the erasing procedure for each erased group; and
if the number of single bit failures falls outside a criterion, performing a further erasing procedure, or else determining that the erasing procedure is complete when the numbers of single bit failures falls within the criterion, wherein the criterion is based upon an correctable number of failures when implementing an error correction code.

10. The method of claim 9, wherein the numbers of single bit failures are summed up to give a total of said numbers, and wherein the criterion is based upon a tolerable maximum total number of failures.

11. The method of claim 9, wherein the error correction code is also provided to correct bits of information in read and write operations.

12. The method of claim 9, further comprising:
reading information from the array of memory cells; and
correcting bits of the read information using the error correction.

13. The method of claim 9, wherein the erasing procedure is determined to be complete if at most a fixed number of single bit failures or a variable number of single bit failures that is specified by the error correction code are verified in every erased group.

14. The method of claim 9, wherein the correctable number of failures comprises between one and five bit failures per group of memory cells.

15. The method of claim 9 wherein the flash memory device comprises a SONOS memory device.

16. The method of claim 9 wherein the flash memory device comprises a floating gate memory device.

17. A memory device comprising:
an array comprising a plurality of groups of flash memory cells;
error correction code circuitry coupled to the array, the error correction code circuitry operable to detect and correct errors in data being read from the array;
erase circuitry coupled to the array, the erase circuitry operable to cause all flash memory cells in a selected group to be effected by an erase procedure; and
erase verification circuitry coupled to the array, the erase verification circuitry operable to read data from the flash memory cells in the selected group after the erase procedure has been effected, the erase verification circuitry detecting a number of single bit failures and determining whether the erase procedure is to be repeated, wherein the erase procedure is to be repeated if the number of single bit failures falls outside a criterion, wherein the criterion is based upon a number of failures that are correctable by the error correction code circuitry.

18. The device claim 17, wherein the correctable number of failures comprises between one and five bit failures per group of memory cells.

19. The device of claim 17, wherein the array of flash memory cells comprises an array of SONOS memory cells.

20. The device of claim 17, wherein the array of flash memory cells comprises an array of floating gate memory cells.

* * * * *